United States Patent [19]

Saiki et al.

[11] 4,001,870
[45] Jan. 4, 1977

[54] ISOLATING PROTECTIVE FILM FOR SEMICONDUCTOR DEVICES AND METHOD FOR MAKING THE SAME

[75] Inventors: Atsushi Saiki, Musashimurayama; Kikuji Sato, Kokubunji; Seiki Harada, Hachioji; Terue Tsunoda, Tokyo; Yoichi Oba, Hachioji, all of Japan

[73] Assignee: Hitachi, Ltd., Japan

[22] Filed: Nov. 30, 1973

[21] Appl. No.: 420,677

Related U.S. Application Data

[63] Continuation-in-part of Ser. No. 389,452, Aug. 20, 1973, abandoned.

[30] Foreign Application Priority Data

Aug. 18, 1972  Japan .................. 47-82165

[52] U.S. Cl. .................. 357/54; 260/47 CP; 260/78 TF; 427/82; 357/72
[51] Int. Cl.² .................. H01L 23/30
[58] Field of Search .............. 357/54, 72; 117/218; 260/47 CP, 78 TF; 427/82

[56] References Cited
UNITED STATES PATENTS

| 3,405,017 | 10/1968 | Gee .................. 317/235 AF |
| 3,411,122 | 11/1968 | Schiller et al. .................. 317/234 E |
| 3,447,975 | 6/1969 | Bilo et al. .................. 317/235 AF |
| 3,597,269 | 8/1971 | Chang et al. .................. 317/234 E |
| 3,597,665 | 8/1971 | Quetsch et al. .................. 317/234 M |
| 3,597,834 | 8/1971 | Lathrop et al. .................. 317/234 M |
| 3,615,913 | 10/1971 | Shaw .................. 317/234 E |
| 3,700,497 | 10/1972 | Epifano et al. .................. 317/234 E |
| 3,725,344 | 4/1973 | Miyadera et al. .................. 260/78 TF |
| 3,725,743 | 4/1973 | Murayama .................. 317/234 M |
| 3,737,340 | 6/1973 | Maeda et al. .................. 317/234 M |
| 3,788,895 | 1/1974 | Schimmer et al. .................. 117/218 |
| 3,801,880 | 4/1974 | Harada et al. .................. 317/234 M |

FOREIGN PATENTS OR APPLICATIONS 702,696  1/1973  Japan .................. 260/78 TF

OTHER PUBLICATIONS

Sato et al, "Multilevel Interconnection . . . Utilizing Polyimide", Proceedings 23rd Electronic Components Conf., Washington, DC, May, 1973, pp. 15–20.
Marsden, "Silicone Coupling Agents," Silicone Technology, Bruins, Ed., Wiley–Interscience, N.Y., 1970, pp. 110–111.
Noll, Chemistry and Technology of Silicones, (NY, Academic Press) 1968; pp. 582–584.

Primary Examiner—William D. Larkins
Attorney, Agent, or Firm—Craig & Antonelli

[57] ABSTRACT

An insulating film provided on the surface of a semiconductor device having a protective film of silicon dioxide is composed of a double layer. The double layer consists of a thin film which is disposed on at least a part of the protective film of silicon dioxide and which is made of an organic compound containing either an amino group as well as an alkoxysilane group or an epoxy group as well as an alkoxysilane group, and a film which is disposed so as to cover the thin film of an organic compound and which is made of a heat-resisting polymer resin.

The heat-resisting polymer is the reaction product of 4,4'-diamino-diphenylether, 4,4'-diamino-diphenyl ether-3-carbonyl amide, and pyromellitic acid dianhydride.

20 Claims, 5 Drawing Figures

ISOLATING PROTECTIVE FILM FOR SEMICONDUCTOR DEVICES AND METHOD FOR MAKING THE SAME

This is a continuation in part of application Ser. No. 389,452, filed Aug. 20, 1973, now abandoned.

BACKGROUND OF THE INVENTION

1. FIELD OF THE INVENTION

The present invention relates to an insulating film for semiconductor devices, and a method for making the same. More particularly, it relates to an insulating film in a multi-layer interconnection structure of two or more layers with a polymer resin film interposed between the interconnection layers, and a method for making the same.

2. DESCRIPTION OF THE PRIOR ART

It has hitherto been the practice to cover a semiconductor device with a polymer resin film and to thus improve the stability and reliability of the semiconductor device. This polymer resin, however has been disadvantageous in that it is prone to exfoliate due to an inferior adhesive property. In a semiconductor integrated circuit, especially a monolithic integrated circuit, a desired interconnection pattern has been produced in such way that a conductor metal, such as aluminum, is evaporated onto a silicon wafer in which elements such as transistors are made, and that the metal at unnecessary parts is removed by well-known photolithographic techniques or that the metal at unnecessary parts is oxidized to form an insulator by anodization employing an electrolyte.

In order to further construct one or more conductor layers on the conductor layer thus produced, a desired interconnection pattern has been formed in such a manner that a film of silicon dioxide is deposited by chemical vapor deposition, RF-sputtering or a similar well-known process, that the silicon dioxide film at parts necessary for the collection of the conductor is thereafter provided with connection or through-holes by well-known photolithography, and that the conductor metal is subsequently evaporated. This prior-art method of manufacture has had the disadvantages that the metal of the second layer is liable to be opened or disconnected on account of a step due to the interconnection conductor of the first layer or a step due to the connection-hole in the insulating film at the connection part between the conductor layers, and that pinholes tend to appear in the insulating film in, for example, a portion in which the first and second layers of the interconnection conductor cross each other, to easily short-circuit the two conductor layers which oppose each other with the insulating film held therebetween. With the process in which, after the evaporation of aluminum, the area other than the interconnection parts is anodized into aluminum oxide, steps at the crossing parts of the interconnection conductor layers are hardly generated. The steps at the connection parts between the layers, however, are still present, so that the second layer interconnection is liable to be disconnected at these parts. Moreover, the aluminum oxide film formed by the anodic oxidation is disadvantageous in being porous and having a poor insulating property.

In order to eliminate the disadvantages of the prior-art method discussed above, there has been proposed a resin insulation method which employs a heat-resistive polymer resin. By applying a prepolymer solution and heating and curing it, the steps can be compensated to form an insulating film having a flat surface. This is advantageous in that the second layer conductor undergoes substantially no disconnection at the stepped portions. The heat-resisting polymer material, however, has the disadvantage of the poor adhesive property, and requires care in its use for the insulating film.

SUMMARY OF THE INVENTION

It is, accordingly, an object of the present invention to provide an insulating film for semiconductor devices which has its reliability enhanced by making reparation for the poor adhesive property of the polymer material, and a method for producing the same.

In order to accomplish such an object, the present invention interposes, between a conventional semiconductor substrate and an insulating film of a polymer resin, conventionally used, a film of an organic compound which contains both an alkoxysilane group containing from 1 to 3 carbon atoms prone to form a chemical bond with an inorganic material and an amino group or an epoxy group (e.g. a vicinal epoxy containing 2 to 3 carbon atoms) prone to form a chemical bond with the polymer material, thereby intending to bond the polymer resin-insulating film and the underlying substrate through secure chemical bonds.

The present invention will be described in more detail hereunder in connection with the embodiments with reference to the accompanying drawing. It is to be understood, however, that these embodiments are merely examples and that the invention can have a variety of modifications without departing from the spirit thereof.

PREFERRED EMBODIMENTS OF THE INVENTION

Embodiment 1

Figure 1:
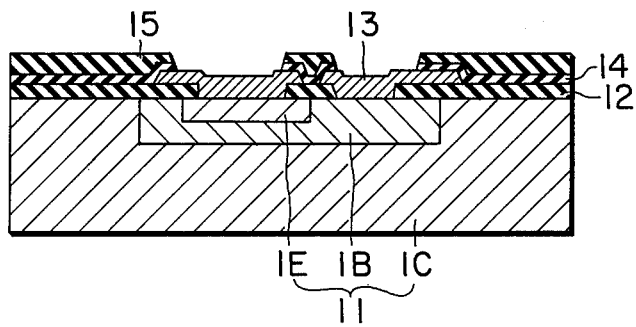
FIG. 1 is a sectional view of a planar transistor of single-layer interconnection which has an insulating film according to the present invention.

FIG. 1 illustrates an embodiment of an insulating film for a semiconductor device according to the present invention. On a semiconductor substrate 11 of silicon in which a semiconductor element including an emitter 1E, a base 1B and a collector 1C is formed in a conventional manner, an insulating film 12 of silicon dioxide is disposed. A conductor layer 13 is electrically connected with the element made in the semiconductor substrate via through-holes provided in the insulating film 12. Parts of the conductor layer 13 extend on the silicon dioxide film 12. On the silicon dioxide film 12 and the conductor layer 13, a film 14 of an amino-silane compound is formed using, in the embodiment shown, N-β(aminoethyl)-γ-aminopropyl methyl dimethoxy silane. On the film 14, there is provided an insulating film 15 of a hea-resistive thermosetting polymer resin. Parts of the insulating film 15 are perforated as may be needed, so as to expose parts of the conductor layer 13.

The film 14 of the amino-silane compound can be formed in the manner described below. Regarding the embodiment, the substrate is immersed in an isopropyl alcohol solution which contains 1 weight % of N-β(aminoethyl)-γ-aminopropyl methyl dimethoxy silane. Thus, the surface of the substrate is caused to absorb the amino-silane compound. The substrate is thereafter washed in water, to wash away the excessive isopropyl alcohol solution containing the amino-silane compound. After swishing the water off, the substrate is dried. Subsequently, a polymer resin-insulating film 15 is formed on the film 14 in the following way. For the heat-resistive high polymer resin, a prepolymer solution of a polyimide resin is applied on the resultant substrate. The polyimide resin used is, for example, one obtained by the reaction between aromatic diamine (e.g. 4,4'-diamino-diphenyl ether) and aromatic tetracarboxylic acid dianhydride (e.g. pyromellitic acid dianhydride), or one obtained by the reaction among an aromatic diamine, aromatic diamine having the aminocarbonyl group (e.g. 4,4'-diamino-diphenylether 3-carbonyl amide) and aromatic tetracarboxylic acid dianhydride or one obtained from reaction of the aromatic diamine, the aromatic carbonyl amide, aromatic tetracarboxylic acid dianhydride and 3,3' 4,4' benzophenon tetracarboxylic acid dianhydride. The applied prepolymer solution is dried at 100° C. Finally, it is heated at 300° C. for 1 hour, to be hardened. Further, the step of providing windows at the predetermined parts of the polymer resin-insulating film 15 is carried out in the following way. On the polymer resin-insulating film hardened by the heating, there is provided a metal film whose etchant differs from that of the conductor layer 13. Then windows are provided at the predetermined parts of the metal film by the use of the well-known photoetching technique. Then those parts of the polymer resin-insulating film which correspond to the windows of the metal film are removed by means of a plasma asher. Thereafter, the metal film is removed. By way of example, the embodiment uses aluminum for the metal conductor layer 13, and chromium for the metal film on the insulating film 15. Used as the liquid etchant of the chromium film is an aqueous solution of ammonium cerium (IV) nitrate. The aqueous solution does not corrode aluminum at all.

EMBODIMENT 2

Figure 2:
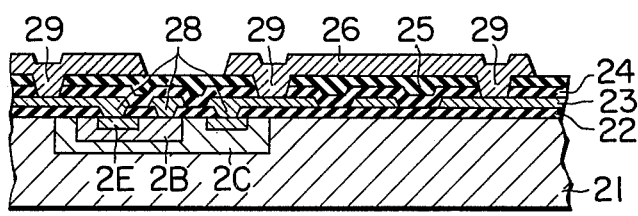
FIG. 2 is a sectional view of a multi-layer interconnection semiconductor device in which, after providing through-holes in the insulating film according to the present invention, the second conductor layer is disposed on the insulating film.

FIG. 2 illustrates an embodiment of an interconnection structure according to the present invention. On a semiconductor substrate 21 in which a semiconductor element including an emitter 2E, a base 2B and a collector 2C is made a silicon dioxide film 22 is disposed which is provided with through-holes 28 at parts for electrical connection with the element. The through-holes 28 are formed by the well-known photoetching process. Disposed on the silicon dioxide film 22 is the first layer of interconnection conductor 23 which is formed by, for example, evaporating aluminum and making use of the photoetching process. The conductor 23 is electrically connected through the through-holes 28 with the semiconductor element as may be needed. A film 24 of an organic compound overlies the conductor 23 and the silicon dioxide film 22. Further, a polymer resin-insulating film 25 overlies the film 24. In the organic compound film 24 and the resin film 25, through-holes 29 leading to the first conductor layer 23 are provided as may be needed. The second conductor layer 26 is electrically connected with the first conductor layer 23 through the though-holes 29.

By way of example, the embodiment employs an aminosilane coupling agent for the film 24, and a heat-resisting polymer resin of the polyimide series for the high polymer resin-insulating film 25. When, for example, "KBM602" (trade name, produced by Shin-Etsu Chemical Industry Corp., a manufacturer in Japan) is used as the amino-silane coupling agent, the heat-resisting polymer resin of the polyimide and the silicon dioxide film are chemically bonded as below. This brings forth the advantage that the polyimide resin inherently having a poor adhesive property adheres securely to the silicon dioxide film.

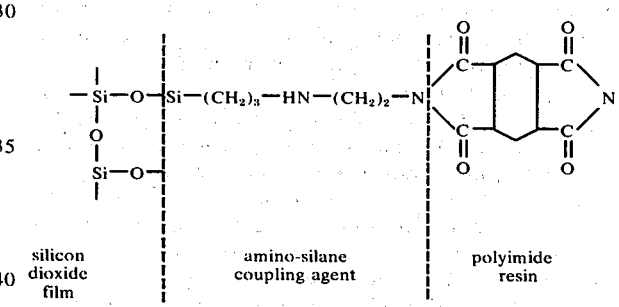

silicon dioxide film | amino-silane coupling agent | polyimide resin

The amino-silane coupling agent is dissolved in an appropriate solvent such as water, ketone, ether and alcohol, to prepare a solution at an appropriate solution of, for example, 0.05 – 20 weight %. Thereafter, the substrate is immersed in the solution or the solution is applied on the substrate. Then, the substrate is dried. In this way, the film of the amino-silane compound can be formed.

EMBODIMENT 3

Figure 3:
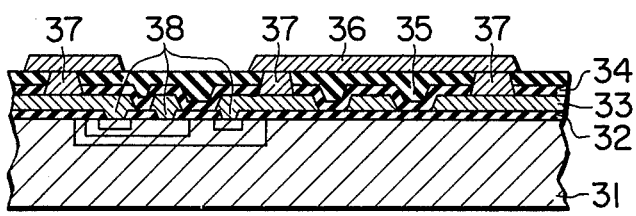
FIG. 3 is a sectional view of a multi-layer interconnection semiconductor device in which trapezoidal projections for the electrical connection between the first and second conductor layers are provided on the first conductor layer, whereupon the insulating film according to the present invention is formed.

Another embodiment is illustrated in FIG. 3. A silicon dioxide film 32 overlies a semiconductor substrate 31. The silicon dioxide film 32 is provided with holes 38 as may be needed. The first conductor interconnection layer 33 is electrically connected through the holes 38 with an element formed in the substrate 31, and extends onto the silicon dioxide film 32. At necessay parts on the first conductor layer 33, minute projections 37 being trapezoidal in section and made of a metal (e.g. aluminum) are provided. The trapezoidal projections 37 serve to electrically connect the first conductor layer 33 with the second conductor layer 36. At the same level as that of the tops of the trapezoidal projections, there is provided a double film which consists of a film 34 of the amino-silane coupling agent and a high polymer film 35 of polyimide.

The second conductor interconnection layer 36 is connected with the trapezoidal projections 37, and extends on the polymer resin film 35. Also in this case, the polyimide resin film 35 and the silicon dioxide film 32 adhere through secure chemical bonds by virtue of the film 34 of the amino-silane coupling agent. The embodiment adopts the structure which employs the trapezoidal projections 37 for the connection between the first conductor layer and the second conductor layer. As compared with the connecting structure stated in embodiment 2, the structure of the embodiment 3 has the advantage that, since the second conductor layer is formed in a manner to extend on a perfect flat surface with no step, it undergoes no disconnection.

EMBODIMENT 4

Figure 4:
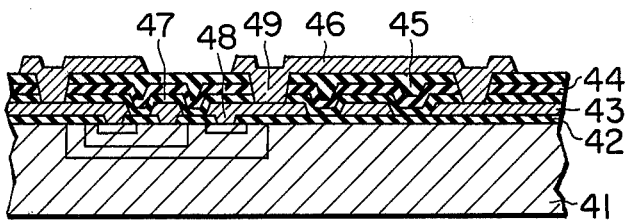
FIG. 4 is a sectional view of a multi-layer interconnection semiconductor device in which a silicon dioxide film is interposed between the insulating film according to the present invention and the first conductor layer in the structure in FIG. 2.

Still another embodiment is illustrated in FIG. 4. A semiconductor element is made in a substrate 41. Shown at 42 is a silicon dioxide film 42, which has through-holes 48 provided at predetermined places. The first conductor layer 43 having a predetermined pattern is electrically connected through the holes 48 with the semiconductor element, and overlies the silicon dioxide film 42. On the first conductor layer 43, a silicon dioxide film 47 is provided by a well-known technique, for example, the sputtering or the chemical vapor deposition. On the silicon dioxide film 47, a film 44 of the amino-silane compound is formed as previously stated. Further, a polymer resin film 45 of the polyimide is formed. Thereafter, through holes 49 are provided at predetermined positions at which the first conductor layer 43 and the second conductor layer 46 are to be electrically connected. Then, the second conductor layer 46 is formed. Since the insulation between the first conductor layer 43 and the second conductor layer 46 is effected by the double film structure consisting of the silicon dioxide film 47 and the polymer film 45, the embodiment advantageously brings forth a perfect insulating film free from pinholes, etc.

EMBODIMENT 5

Figure 5:
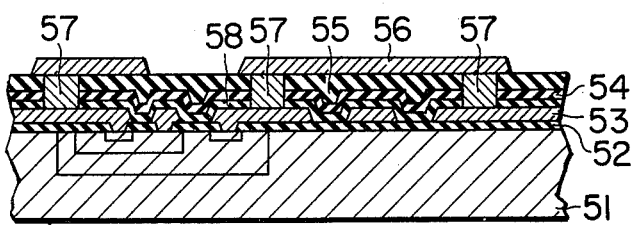
FIG. 5 is a sectional view of a multi-layer interconnection semiconductor device in which a silicon dioxide film is interposed between the insulating film according to the present invention and the first conductor layer in the structure in FIG. 3.

FIG. 5 shows another embodiment. On a substrate 51 in which a semiconductor element is made, a silicon dioxide film 52 is provided. The first conductor layer 53 having a predetermined pattern is electrically connected with the semiconductor element via the through-holes provided in predetermined places of the silicon dioxide film 52, and it overlies the silicon dioxide film 52. A silicon dioxide film 58 is subsequently provided on the layer 53 and the film 52 by a well-known process such as the sputtering and the chemical vapor deposition. After through-holes are provided at predetermined parts of the silicon dioxide film 58, conductive projections 57 being trapezoidal in section are disposed at the parts of the holes.

Thereafter, a film 54 of the amino-silane compound is formed as previously stated. Further, a polymer resin film 55 of polyimide is formed. The amino-silane compound and the polymer resin which cover the tops of the trapezoidal projections 57 are etched by such means as exposure to a plasma discharge atmosphere, ion beam irradiation, and sputtering, so as to expose the surfaces of the trapezoidal projections 57. Then, the second conductor layer 56 is formed. According to the embodiment, since the insulating film is of the double structure consisting of the polymer resin 55 and the silicon dioxide film 58, it is one of very excellent insulating property without any pinhole. Simultaneously therewith, since the trapezoidal projections are employed for the connection between the first conductor layer and the second conductor layer, the steps coming into question in the prior-art method do not appear, and the interconnection of the so-called planar structure is possible. This ensures an interconnection structure which undergoes no disconnection and which is high in reliability.

EMBODIMENT 6

In the embodiments 1 to 5, it has been described as being effective to employ the polyimide resin as the polymer resin material and to apply the amino-silane as the organic compound suitable for bonding the resin to the substrate. In order to accomplish the object of the present invention, it is also allowed to employ a heat-resisting polymer resin of the epoxy series as the polymer resin material and to apply an epoxy-silane compound thereto. It has been verified that quite the same effect is produced in this case. A few examples of the combination by which the foregoing effect is recognized ae mentioned below.

Compounds for the polymer resin material of the polyimides:

1. γ-aminopropyl triethoxy silane ("A1100," Union Carbide Co.)
2. N-β(aminoethyl)-γ-aminopropyl triethoxy silane "Y1120," Union Carbide Co., "Z6020," Dow Corning Co., "KBM 602," Shin-Etsu Chemical Industry Corp.
3. N-β-(aminoethyl)-γ-aminopropyl methyl dimethoxy silane ("KBM 602," Shin-Etsu Chemical Industry Corp.)

Compounds for the polymer materials of the epoxy and phenol resin:

1. β-(3,4 Epoxycyclohexyl) ethyl trimethoxy silane "A186," Union Carbide Co., "KBM 303," Shin-Etsu Chemical Industry Corp.
2. γ-Glycidoxy propyl trimethoxy silane "A187," Union Carbide Co., "Z6043," Dow Corning Co. "KBM 403," Shin-Etsu Chemical Industry Corp.

A suitable epoxy is bis(3,4 epoxy-6-methyl-cyclohexylmethyl) adipate and as phenolic resin BKR 2620 a product of Union Carbide Co. is suitable.

Although, in the foregoing embodiments, the substrate has been described as being of the semiconductor, it is obvious that the insulating film of the present invention is also applicable to a thin-film circuit provided on an insulator substrate. Also, in addition to a Si substrate, a dielectric substrate such as ceramics and glass can be used.

While the novel principles of the invention have been described, it will be understood that various omissions, modifications and changes in these principles may be made by one skilled in the art without departing from the spirit and scope of the invention.

What is claimed is:

1. An insulating film for a semiconductor device including a substrate which contains therein a semiconductor element and which is made of a material selected from the group consisting of a semiconductor material and an insulator material, comprising:
   a protective film of silicon dioxide disposed on the surface of said substrate; and
   a polymer resin film obtained by a reaction of an aromatic diamine, an aromatic diamine having a single aminocarbonyl group which is in an ortho position with respect to one of the amine groups and an aromatic tetracarboxylic acid dianhydride, which is disposed over said protective film.

2. The insulating film for a semiconductor device according to claim 1, which further comprises a thin film of an organic compound provided between said protective film and said polymer resin film, said organic compound containing the alkoxysilane group and one selected from the group consisting of the amino group and the epoxy group.

3. The insulating film for a semiconductor device according to claim 2, wherein said organic compound is one selected from the group consisting of γ-aminopropyl triethoxy silane, N-β(aminoethyl)-γ-aminopropyl triethoxy silane and N-β(aminoethyl)-γ-aminopropyl methyl dimethoxy silane.

4. The insulating film for a semiconductor device according to claim 1 wherein said semiconductor device further includes a first interconnection conductor layer with a predetermined pattern, which is connected with said semiconductor element through openings provided in said protective film and which is provided on said protective film, said polymer resin film have through-holes at predetermined parts on said first interconnection conductor layer, and a second interconnection conductor layer with a predetermined pattern is further provided on said polymer resin film, said second interconnection conductor layer being electrically connected with said first interconnection conductor layer through said holes.

5. The insulating film for a semiconductor device according to claim 2 wherein said semiconductor device further includes a first interconnection conductor layer with a predetermined pattern, which is connected with said semiconductor element through openings provided in said protective film and which is provided on said protective film, said polymer resin film have through-holes at predetermined parts on said first interconnection conductor layer, and a second interconnection conductor layer with a predetermined pattern is further provided on said polymer resin film, said second interconnection conductor layer being electrically connected with said first interconnection conductor layer through said holes.

6. A method for making an insulating film for a semiconductor device including a substrate which contains therein a semiconductor element and which is made of a material selected from the group consisting of a semiconductor material and an insulator material, comprising the steps of:
forming silicon dioxide film on the surface of said substrate;
applying a prepolymer solution of a polymer resin obtained by a reaction of an aromatic diamine, an aromatic diamine having a single aminocarbonyl group which is an ortho position with respect to one of the amine groups and an aromatic tetracarboxylic acid dianhydride over the surface of said silicondioxide film; and
thermally curing said prepolymer solution.

7. A method for making an insulating film for a semiconductor device including a substrate which contains therein a semiconductor element and which is made of a material selected from the group consisting of a semiconductor material and an insulator material, comprising the steps of:
forming silicon dioxide film on the surface of said substrate;
applying a thin film of an organic compound onto at least a part of the surface of said silicon dioxide film, said organic compound containing the alkoxysilane group and one selected from the group consisting of the amino group and the epoxy group;
coating said thin film coating of said organic compound with a prepolymer solution of a polymer resin obtained by a reaction of an aromatic diamine, an aromatic diamine having a single aminocarbonyl group which is in an ortho position with respect to one of the amine groups and an aromatic tetracarboxylic acid dianhydride not yet hardened, so as to cover said thin film of said organic compound; and
thermally curing said prepolymer solution.

8. The method for making an insulating film for a semiconductor device according to claim 7, wherein said organic compound is one selected from the group consisting of γ-aminopropyltriethoxy silane, N-β(aminoethyl)-γ-aminopropyl triethoxy silane and N-β(aminoethyl)-γ-aminopropyl methyl dimethoxy silane.

9. A method for making an insulating film for a semiconductor device, comprising the steps of:
preparing a substrate which contains therein a semiconductor element and which is made of a material selected from the group consisting of a semiconductor material and an insulator material;
providing a protective film of silicon dioxide on said substrate;
providing openings in said protective film;
forming on said protective film a first interconnection conductor layer which has a predetermined pattern and which is made of a metal, said first interconnection conductor layer being connected with said semiconductor element through said openings;
applying a prepolymer solution of a polymer resin obtained by a reaction of an aromatic diamine, an aromatic diamine having a single aminocarbonyl group which is in an ortho position with respect to one of the amine groups and an aromatic tetracarboxylic acid dianhydride over the surface of said first interconnection conductor layer and said protective film;
thermally curing said prepolymer solution;
providing through-holes at predetermined parts of said polymer resin film; and
forming a second interconnection conductor layer which is electrically connected with said first interconnection conductor layer through said holes and which extends on said polymer resin film.

10. A method for making an insulating film for a semiconductor device, comprising the steps of:
preparing a substrate which contains therein a semiconductor element and which is made of a material selected from the group consisting of a semiconductor material and an insulator material;
providing a protective film of silicon dioxide on said substrate;
providing openings in said protective film;
forming on said protective film a first interconnection conductor layer which has a predetermined pattern and which is made of a metal; said first interconnection conductor layer being connected with said semiconductor element through said openings;

applying a thin film of an organic compound over said first interconnection conductor layer and said protective film, said organic compound containing the alkoxysilane group and one selected from the group consisting of the amino group and the epoxy group;

coating said thin film of said organic compound with a prepolymer solution of a polymer resin obtained by a reaction of an aromatic diamine, an aromatic diamine having a single aminocarbonyl group which is an ortho position with respect to one of the amine groups and aromatic tetracarboxylic acid dianhydride;

thermally curing said prepolymer solution;

providing through-holes at predetermined parts of said polymer resin film; and forming a second interconnection conductor layer which is electrically connected with said first interconnection conductor layer through said holes and which extends on said polymer resin film.

11. A semiconductor device comprising:
a substrate which contains therein a semiconductor element and which is made of a material selected from the group consisting of a semiconductor material and an insulator material;
a protective film of silicon dioxide disposed on the surface of said substrate;
a first interconnection conductor layer having a predetermined pattern and connected with said semiconductor element through openings provided in said protective film;
a polymer resin film obtained by a reaction of an aromatic diamine, an aromatic diamine having a single aminocarbonyl group which is in an ortho position with respect to one of the amine groups and an aromatic tetracarboxylic acid dianhydride which is disposed over surface of said first interconnection conductor layer and said protective film; and
a second interconnection conductor layer having a predetermined pattern which is disposed on said polymer resin film and is electrically connected with said first interconnection conductor layer through holes provided in said polymer resin film.

12. A semiconductor device comprising:
a substrate which contains therein a semiconductor element and which is made of a material selected from the group consisting of a semiconductor material and an insulator material;
a protective film of silicon dioxide disposed on the surface of said substrate;
a first interconnection conductor layer having a predetermined pattern and connected with said semiconductor element through openings provided in said protective film;
a thin film of an organic compound disposed on said first interconnection conductor layer and said protective film, said organic compound containing the alkoxysilane group and one selected from the group consisting of the amino group and the epoxy group;
a polymer resin film obtained by a reaction of an aromatic diamine, an aromatic diamine having a single aminocarbonyl group which is in an ortho position with respect to one of the amine groups and an aromatic tetracarboxylic acid dianhydride, which is disposed on the surface of said thin film; and
a second interconnection conductor layer having a predetermined pattern which is disposed on said polymer resin film and is electrically connected with said first interconnection conductor layer through holes provided in said polymer resin film.

13. The semiconductor device according to claim 12, wherein said organic compound is one selected from the group consisting of γ-aminopropyl triethoxy silane, N-β(aminoethyl)-γ-aminopropyl triethoxy silane and N-β(aminoethyl)-γ-aminopropyl methyl dimethoxy silane.

14. The semiconductor device according to claim 12, wherein said aromatic diamine is 4,4'-diamino-diphenylether, the aromatic diamine having the aminocarbonyl group is 4,4'-diaminodiphenyl ether-3-carbonyl amide and the aromatic tetracarboxylic acid dianhydride is pyromellitic acid dianhydride.

15. An insulating film material in combination with a substrate of a semiconductor device, said insulating film material being disposed on said substrate and said substrate being a material selected from the group consisting of a semiconductor material and an insulator material, said insulating film material comprising a protective film of silicon dioxide disposed on the surface of said substrate and a polymer resin film obtained by reaction of an aromatic diamine, an aromatic diamine having a single aminocarbonyl group which is in an ortho position with respect to one of the amine groups and an aromatic tetracarboxylic acid dianhydride, which resin film is disposed over said protective film.

16. The insulating film material according to claim 15, wherein said substrate is an insulator material.

17. The insulating film material according to claim 15, wherein sad substrate is a semiconductor material.

18. The insulating film material according to claim 16, which further comprises a thin film of an organic compound provided between said protective film and said polymer resin film, said organic compound containing an alkoxysilane group and one selected from the group consisting of the amino group and the epoxy group.

19. An insulating film material from a semiconductor device having a substrate which is a material selected from the group consisting of a semiconductor material and an insulator material, which comprises a protective film of silicon dioxide disposed on said substrate and a polymer resin film disposed over said protective film and obtained by reaction of an aromatic diamine, an aromatic diamine having a single aminocarbonyl group which is in an ortho position with respect to one of the amine groups and an aromatic tetracarboxylic acid dianhydride.

20. A semiconductor device which comprises an insulating film material in combination with a substrate, said insulating film being disposed on said substrate and said substrate being a material selected from the group consisting of a semiconductor material and an insulator material, said insulating film material comprising a polymer resin film obtained by reaction of an aromatic diamine, an aromatic diamine having a single aminocarbonyl group which is in an ortho position with respect to one of the amine groups and an aromatic tetracarboxylic acid dianhydride.

* * * * *